(12) United States Patent
Wilhelm

(10) Patent No.: US 7,598,539 B2
(45) Date of Patent: Oct. 6, 2009

(54) HETEROJUNCTION BIPOLAR TRANSISTOR AND METHOD FOR MAKING SAME

(75) Inventor: Detlef Wilhelm, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/756,637

(22) Filed: Jun. 1, 2007

(65) Prior Publication Data

US 2008/0296623 A1  Dec. 4, 2008

(51) Int. Cl.
*H01L 29/739* (2006.01)
*H01L 31/0328* (2006.01)
*H01L 31/0336* (2006.01)
*H01L 31/072* (2006.01)
*H01L 31/109* (2006.01)

(52) U.S. Cl. ............... 257/197; 257/198; 257/E29.033

(58) Field of Classification Search ......... 257/197–198, 257/E29.033
See application file for complete search history.

(56) References Cited

U.S. PATENT DOCUMENTS

| | | | | |
|---|---|---|---|---|
| 5,340,755 A | * | 8/1994 | Zwicknagl et al. | 438/312 |
| 5,399,511 A | * | 3/1995 | Taka et al. | 438/311 |
| 5,726,462 A | * | 3/1998 | Spahn et al. | 257/76 |
| 5,962,880 A | * | 10/1999 | Oda et al. | 257/198 |
| 6,521,974 B1 | * | 2/2003 | Oda et al. | 257/593 |
| 6,552,374 B2 | * | 4/2003 | Han et al. | 257/197 |
| 6,667,521 B2 | * | 12/2003 | Ahlgren et al. | 257/370 |
| 6,787,427 B2 | * | 9/2004 | Greenberg et al. | 438/309 |
| 6,861,323 B2 | * | 3/2005 | Shideler | 438/309 |
| 6,869,852 B1 | * | 3/2005 | Joseph et al. | 438/309 |
| 6,884,689 B2 | * | 4/2005 | Chuang et al. | 438/369 |
| 6,974,977 B2 | * | 12/2005 | Washio et al. | 257/197 |
| 6,989,557 B2 | * | 1/2006 | Chen | 257/197 |
| 7,485,537 B2 | * | 2/2009 | Ho et al. | 438/309 |
| 2002/0197809 A1 | * | 12/2002 | Asai et al. | 438/312 |
| 2004/0067609 A1 | * | 4/2004 | Lee | 438/133 |
| 2005/0242373 A1 | * | 11/2005 | Ahlgren et al. | 257/197 |
| 2007/0045664 A1 | * | 3/2007 | Miura et al. | 257/197 |
| 2008/0035955 A1 | * | 2/2008 | Sato et al. | 257/197 |

* cited by examiner

Primary Examiner—Ida M Soward
(74) Attorney, Agent, or Firm—Philip H. Schlazer

(57) ABSTRACT

A heterojunction bipolar transistor: The transistor may a collector layer, a base layer and an emitter layer. The transistor may include a dielectric material being disposed over the base layer. The base layer may be a SiGe base layer.

26 Claims, 7 Drawing Sheets

HETEROJUNCTION BIPOLAR TRANSISTOR AND METHOD FOR MAKING SAME

FIELD OF THE INVENTION

Generally, the present invention relates to transistors and methods of making transistors. More particularly, the present invention relates to bipolar transistors.

BACKGROUND OF THE INVENTION

By way of general background, in bipolar transistors two types of current carriers, electrons and "holes," are involved in the conduction mechanism of the device. A bipolar integrated circuit typically comprises many interconnected bipolar transistors, each of which may be a three-terminal device having a base region, a collector region and an emitter region. The collector and emitter regions of a transistor may be doped with impurities that are of the same conductivity type, for example n-type or p-type, and the base region may be of the opposite conductivity type. The transistor is then to be of the n-p-n or the p-n-p type.

Growth in both high-frequency wired and wireless markets has introduced new opportunities where semiconductors such as SiGe have unique advantages over bulk complementary metal oxide semiconductor technology. Because of the characteristics of the bipolar transistor, and because of the signal processed by the transistor in the radio frequency circuit is a signal having high frequency, the bipolar transistor, especially the SiGe heterojunction bipolar transistor is frequently employed in the radio frequency circuit.

SUMMARY OF THE INVENTION

An embodiment of the invention is a heterojunction bipolar transistor, comprising: a collector layer; a dielectric stack including at least a second dielectric layer overlying a first dielectric layer, the stack overlying the collector layer, the stack having an opening therethrough; and a base layer disposed within the opening.

Another embodiment of the invention is a heterojunction bipolar transistor, comprising: a collector layer; an emitter layer; an base layer disposed between the collector layer and the emitter layer; and a dielectric material disposed between a portion of the collector layer and a portion of the base layer.

Another embodiment of the invention is heterojunction bipolar transistor, comprising: a collector layer; a dielectric material disposed on an upper surface of the collector layer; and a base layer disposed on an upper surface of the dielectric material.

Another embodiment of the invention is a method of making a heterojunction bipolar transistor, comprising: forming a collector layer; forming a stack of at least a second dielectric layer overlying a first dielectric layer, the stack formed over the collector layer; removing a portion of each of the dielectric layers to form an opening through the stack; and forming a base layer within the opening.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
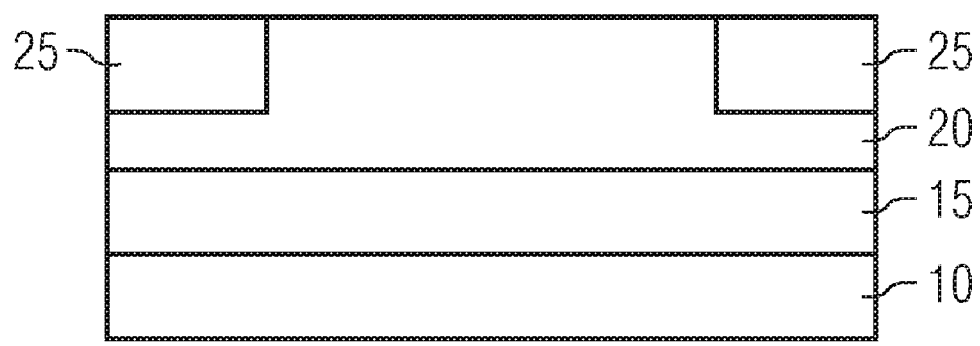
FIG. 1 shows an embodiment of a partially completed transistor structure of the present invention.

FIG. 1 shows an embodiment of a partially completed semiconductor device of the present invention. FIG. 1 shows a substrate 10. In one or more embodiments of the invention, the substrate 10 is a p-type substrate. However, more generally, in one or more embodiments of the invention, the substrate may be a silicon substrate or other suitable substrate. The substrate may be a silicon-on-insulator (SOI) substrate. The SOI substrate may, for example, be formed by a SIMOX process. The substrate may be a silicon-on-sapphire (SOS) substrate.

A collector region 20 is formed within the substrate 10. In one or more embodiments of the invention, the collector region 20 is formed of a lightly doped (e.g. n-doped) n-type material. Isolation regions 25 are defined in the substrate. In the embodiment shown, the isolation regions 25 are shown as trenches etched into the substrate 10 that have been filled with an insulating material, such as $SiO_2$ or other suitable insulating material, to insulate one transistor cell from adjacent transistor cells. In the embodiment shown, the isolation regions 25 are formed using a shallow trench isolation (STI) process. However, in other embodiments of the invention, isolation regions may be formed otherwise, such as by a LOCOS process. Additionally, deep trench isolation regions (not shown in FIG. 1) may also be formed in the substrate. In addition, the substrate may further include a buried channel layer 15. In the embodiment shown in FIG. 1, the buried channel layer may be formed as an n+ doped layer within the substrate 10 and disposed below the collector region 20.

Figure 2:
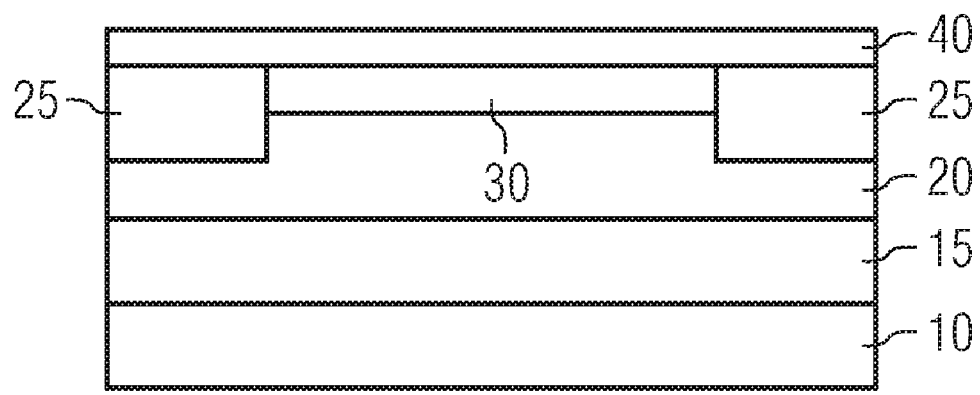
FIG. 2 shows an the formation of first and second oxide layers over the structure shown in FIG. 1 in accordance with an embodiment of the invention.

Referring to FIG. 2, after the formation of the isolation regions 25, a first oxide layer 30 is formed over the substrate. In the embodiment shown, the first oxide layer 30 is formed over the n-doped collector region 20 between the isolation trenches 25. In the embodiment shown, the first oxide layer is a grown oxide such as silicon dioxide ($SiO_2$). However, in other embodiments, the first oxide may be another type of oxide. Likewise, in other embodiments, the first oxide layer may be formed over the isolation regions 25. Examples of oxides include, but are not limited to, CVD oxides (such as a TEOS oxide) and nitrided oxides. The thickness of the first oxide layer 30 is not limited to any particular thickness. In an embodiment of the invention, the first oxide layer 30 may have a thickness of about 10 nm to about 100 nm. In an embodiment of the invention, the first oxide layer 30 may have a thickness of about 20 nm to about 40 nm. As an example, the thickness of the first oxide layer 30 may be about 30 nm.

Referring again to FIG. 2, a second oxide layer 40 is formed over the first oxide layer 30. In an embodiment of the invention, the second oxide layer 40 is formed of a CVD oxide such as a TEOS oxide. However, in other embodiments of the invention, any other type of oxide may be used instead. The thickness of the second oxide layer 30 is not limited to any particular thickness. In an embodiment of the invention, the second oxide layer 40 may have a thickness of about 10 nm to about 100 nm. In another embodiment of the invention, the thickness may be around 10 nm to about 50 nm. As an example, the thickness may be about 40 nm. Referring to FIG. 2, the first oxide layer 30 and the second oxide layer 40 form an oxide stack.

Figure 3:
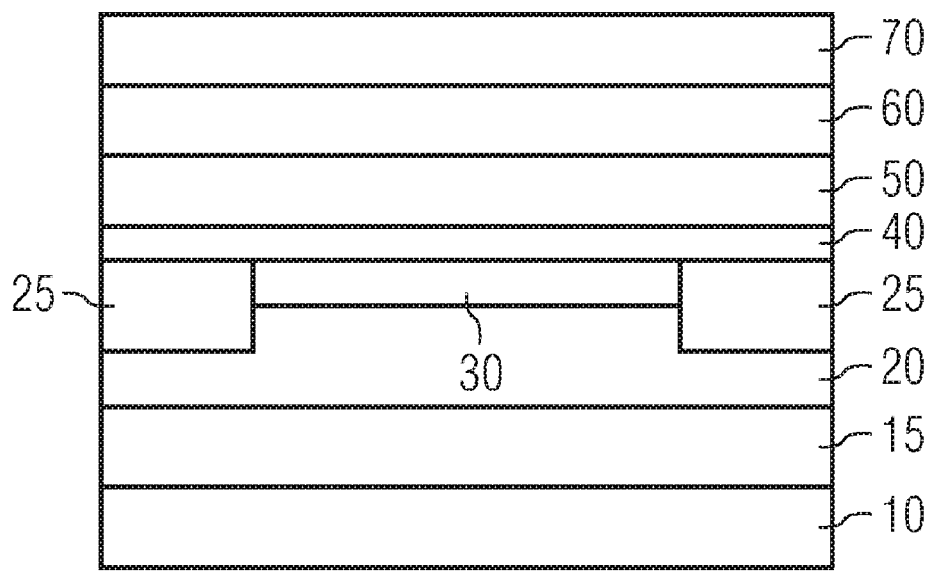
FIG. 3 shows the formation of polysilicon, oxide and nitride layers over the structure shown in FIG. 3 in accordance with an embodiment of the invention.

Referring to FIG. 3, a p+ polysilicon layer 50 is formed over the second oxide layer 40. The p+ polysilicon layer 50 may be formed by first depositing a layer of polysilicon which is then appropriately doped with a p-type dopant so as to form a p+ doped layer. An oxide layer 60 is formed over the p+ polysilicon layer 50. The oxide layer 60 may be formed of a CVD oxide such as a TEOS oxide. In one or more embodiments of the invention, other types of oxides may also be used. A nitride layer 70 is formed over the oxide layer 60. The nitride layer 70 may be formed of a silicon nitride or any other type of nitride.

Figure 4:
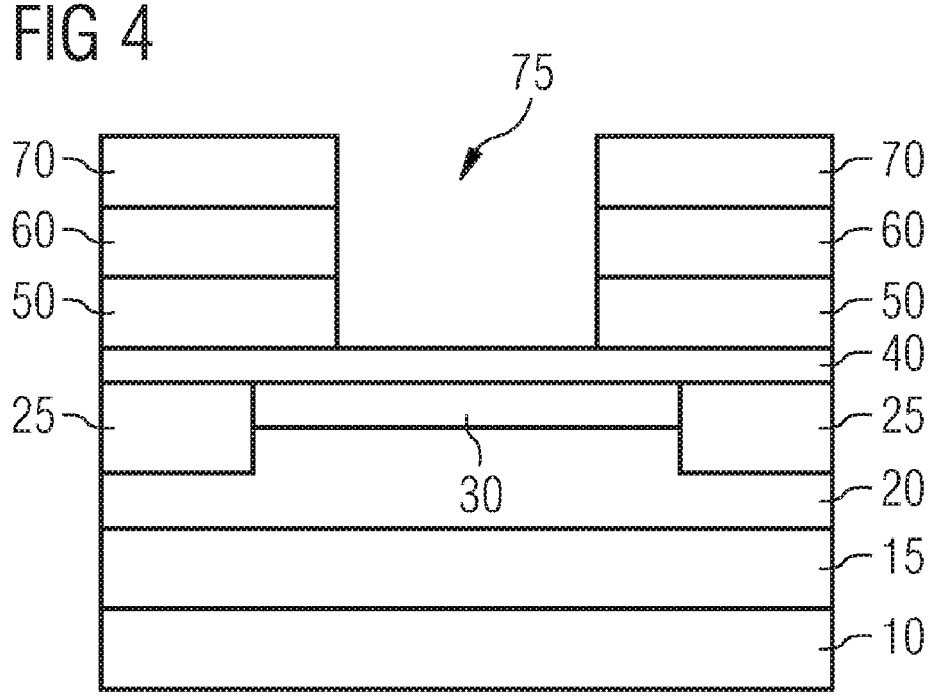
FIG. 4 shows the formation of an opening through the polysilicon, oxide and nitride layers shown in FIG. 3 in accordance with an embodiment of the invention.

Referring to FIG. 4, the stack of layers comprising the p+ polysilicon layer 50, the oxide layer 60 and the nitride layer 70 are then etched and an opening 75 is formed in these layers so as to expose the second oxide layer 40. The opening 75 may be formed using a reactive ion etch (RIE). The opening 75 is also referred to herein as the emitter window.

Figure 5:
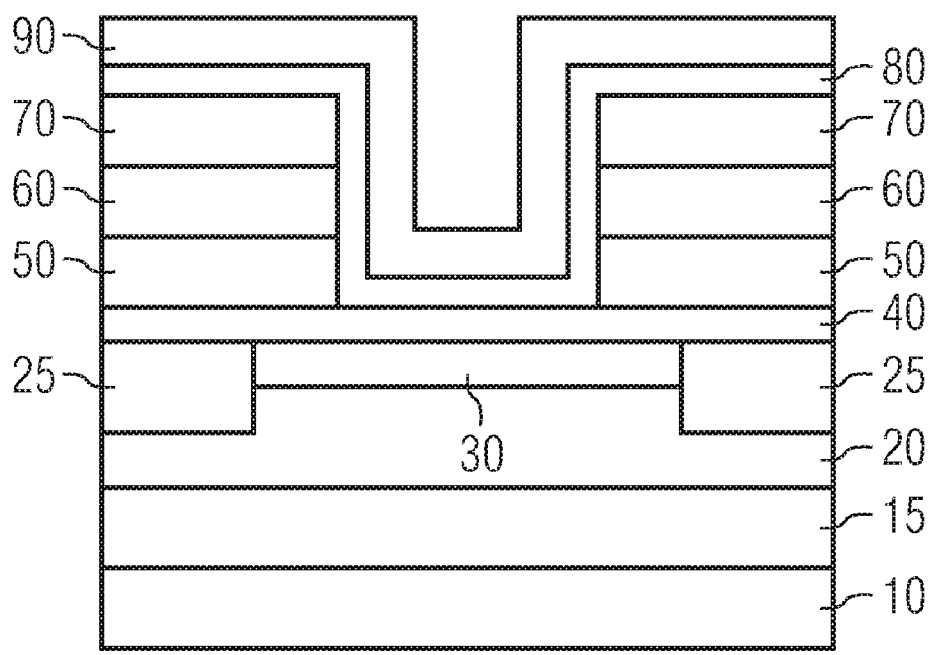
FIG. 5 shows the formation of nitride and polysilicon layers over the structure shown in FIG. 4 in accordance with an embodiment of the invention.

Referring to FIG. 5, a nitride layer 80 is conformally deposited onto the bottom and sidewall surfaces of the opening 75 (shown in FIG. 4) as well as over the top surface of the nitride layer 70. A polysilicon layer 90 is then conformally deposited over the nitride layer 80.

Figure 6:
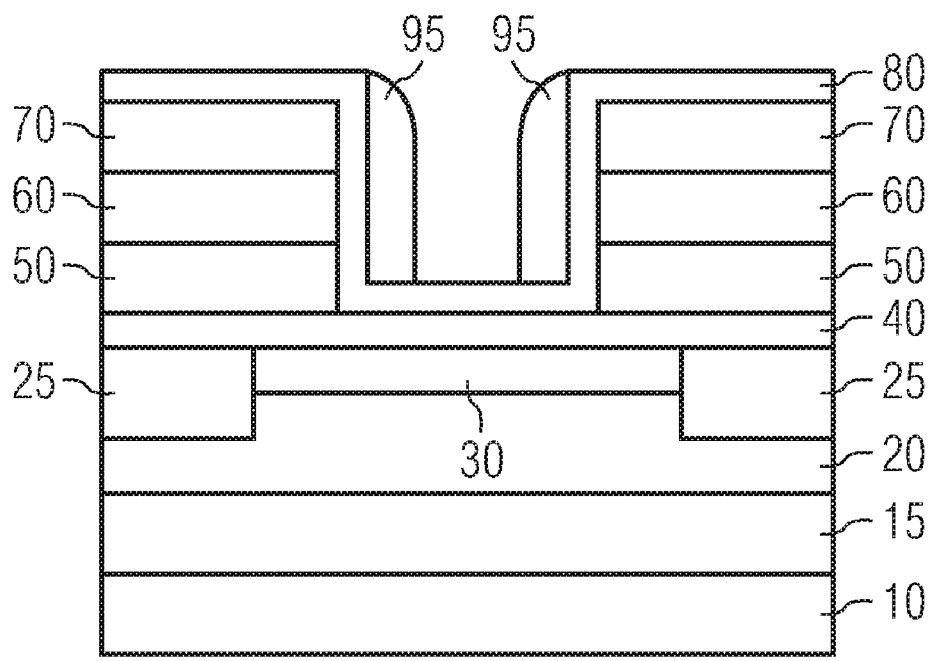
FIG. 6 shows the formation of polysilicon spacers in accordance with an embodiment of the invention.
Figure 7:
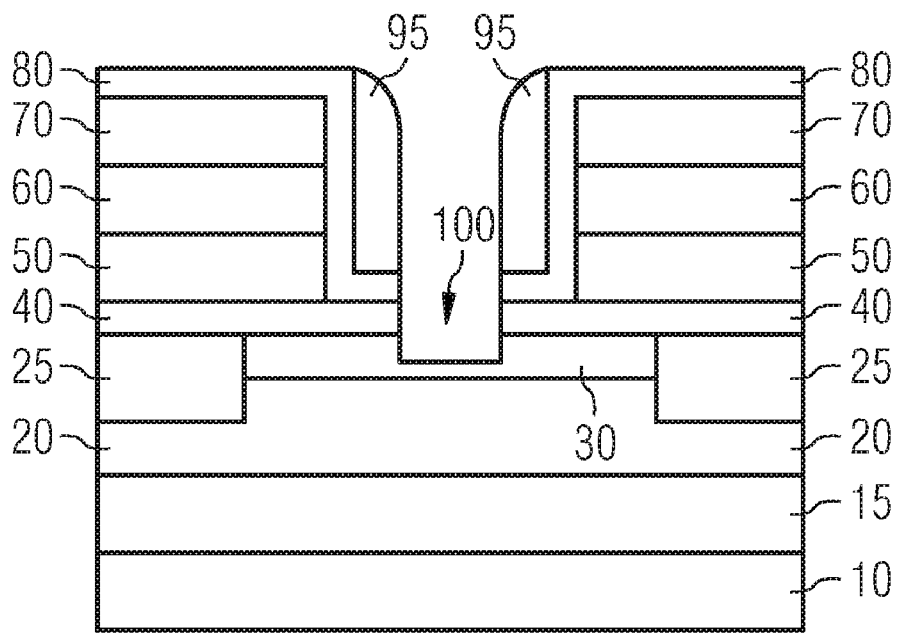
FIG. 7 shows the formation of an opening in the structure of FIG. 6 in accordance with an embodiment of the invention.

Referring to FIG. 6, the polysilicon layer 90 is then anisotropically etched to form polysilicon spacers 95. Referring to FIG. 7, the polysilicon spacers 95 serve as a mask so that an opening 100 may be formed which etches completely through the nitride layer 80, the second oxide layer 40 and stops within the first oxide layer 30 so that the collector layer 20 is not exposed. The opening 100 may be formed using a reactive ion etching process (RIE). It is possible, that in another embodiment of the invention, an opening is formed that additionally goes completely through the first oxide layer 30.

Figure 8:
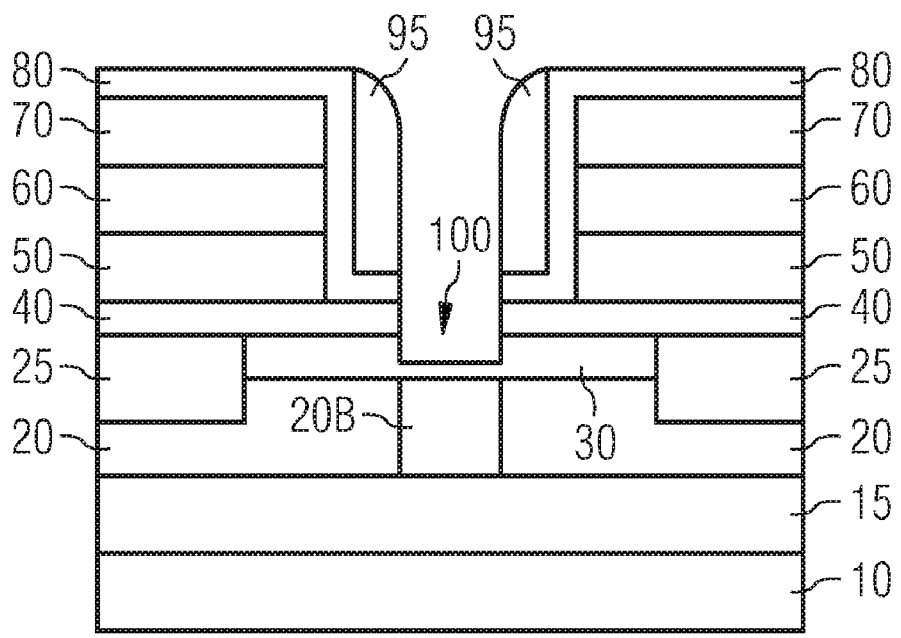
FIG. 8 shows a collector implant in the structure of FIG. 7 in accordance with an embodiment of the invention.

Referring to FIG. 8, after the opening 100 is formed, a collector implant process is performed wherein the structure within the emitter window is doped using an n-type dopant such as phosphorous. As a result of this n-type doping process, a central portion 20B of the collector layer 20 underlying the opening 100 becomes a more heavily doped n-type region while the remaining portion of the collector layer 20 (outside of the central portion 20B) remains as a more lightly doped n-portion.

Figure 9:
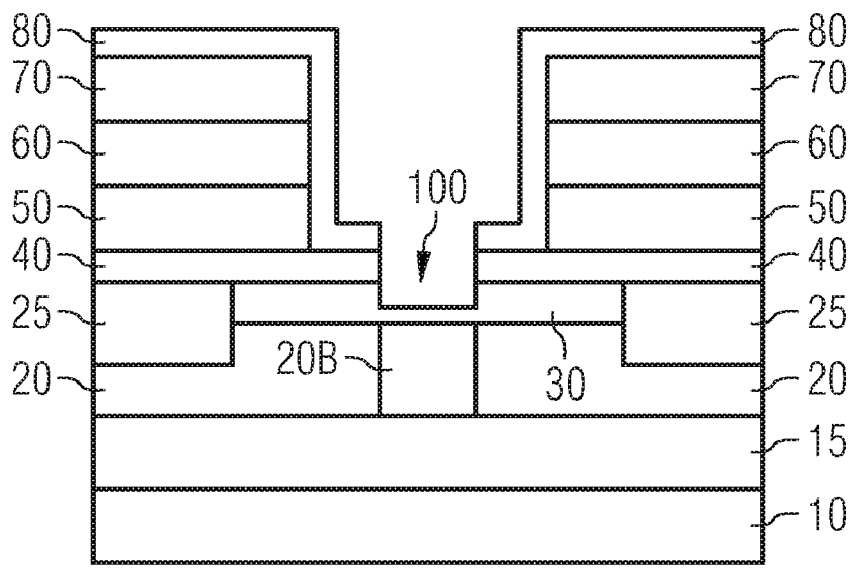
FIG. 9 shows the removal of polysilicon spacers from the structure of FIG. 8 in accordance with an embodiment of the invention.

Referring to FIG. 9, after the collector implant process is completed, the polysilicon spacers 95 are removed. This may be performed using a wet etch process.

Figure 10:
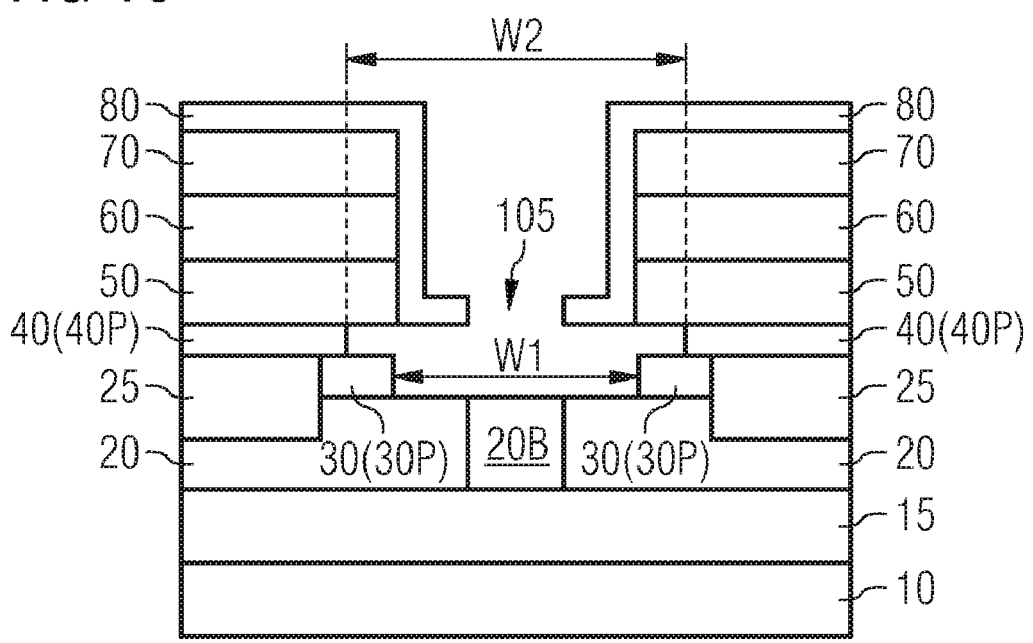
FIG. 10 shows the result of etching first and second oxide layers in the structure of FIG. 9 in accordance with an embodiment of the invention.

Referring to FIG. 10, the oxide stack comprising the first oxide layer 30 and the second oxide layer 40 is then etched using an isotropic etch (for example, a wet isotropic HF etch) to remove at least a portion of the first oxide layer 30 as well as at least a portion of the second oxide layer 40. In one or more embodiments of the invention, the etching is performed so as to remove central portions of both the first and second oxide layers 30, 40. In one or more embodiments of the invention, the etching leaves an outer portion 30P of the first oxide layer 30 and an outer portion 40P of the second oxide layer 40. The etching process may be viewed as creating an opening 105 though the oxide stack comprising the first and second oxide layers 30, 40. In one or more embodiments, the opening 105 may be in the form of a hole. The hole may have any shape. For example, the hole may be square, rectangular or round. In one or more embodiments, it may be possible that the opening may be in the form of a trench.

The opening 105 may be viewed as comprising a first opening portion through the first oxide layer 30 and a second opening portion through the second oxide layer 40. The width of the first opening portion is shown as W1. The width of the second opening portion is shown as W2. In the embodiment shown, W2 is greater than W1. Hence, in the embodiment shown, the width W2 at the top of the opening 105 is greater than the width W1 at the bottom of the opening 105.

In the embodiment shown, the etch rate r2 of the second oxide layer 40 is greater than the etch rate r1 of the first oxide layer 30. Hence, the speed of removal of the second layer 40 is greater than the speed of removal of the first layer 30. The etch process creates a step-like structure in the stack of oxide layers 30, 40. Hence, the etch process creates a step-like structure in the sidewalls of the opening 105 shown in FIG. 10. In the embodiment shown in FIG. 10, the sidewall(s) of the first opening portion (the opening through oxide layer 30) as well as the sidewall(s) of the second opening portion (the opening through the oxide layer 40) are shown as essentially vertical. However, in one or more other embodiments of the invention, the sidewalls of the first opening portion and/or the second opening portion may be sloped.

In one or more embodiments of the invention, the etching process removes a central portion of the first oxide layer 30 but leaves an outer portion 30P which overlies the collector layer 20. In the embodiment shown, the remaining outer portion 30P of the first oxide layer 30 makes direct contact with the collector layer 20. In addition, in the embodiment of the invention shown, the etching process is sufficient to create an undercut below the nitride layer 80 so as to expose a bottom surface of the nitride layer 80. In the embodiment shown, the etching process is also sufficient to create an undercut below the p+ polysilicon layer 50 so as to expose at least a portion of the bottom surface of the polysilicon layer 50.

Figure 11:
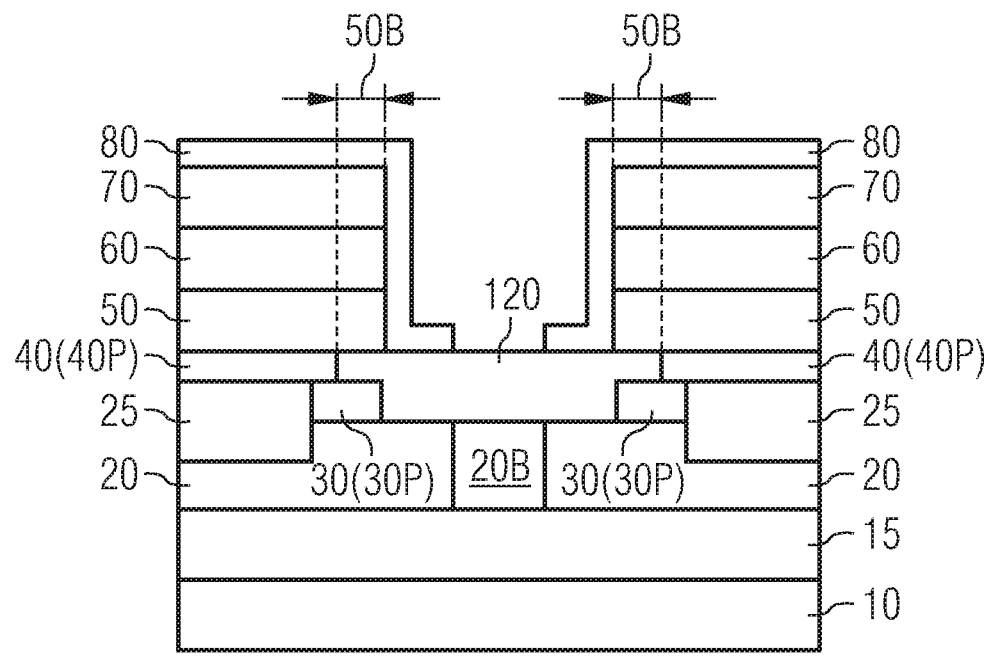
FIG. 11 shows the formation of a SiGe base layer in accordance with an embodiment of the invention.

FIG. 11 shows the formation of a base layer 120. In one or more embodiments of the invention the base layer 120 is a SiGe base layer. The SiGe base layer may be formed by selective epitaxy. Referring to the embodiment shown in FIG. 11, starting from a top surface of the collector 20 (including a top surface of the more heavily doped portion 20B of collector 20) there is an epitaxial growth of a SiGe monocrystalline portion. Likewise, starting from the bottom, overhanging surface 50B of the p+ polysilicon layer 50, there is an epitaxial growth of a SiGe polycrystalline portion. No growth of the SiGe base layer takes places on the surfaces of the oxide or nitride layers. The monocrystalline and polycrystalline SiGe portions grow together and make contact so there is a conductive pathway between the p+ polysilicon layer 50 and the collector layer 20. As noted above, the collector layer 20 includes the more heavily doped portion 20B. In one or more embodiments of the invention, the base layer 120 is a SiGe base layer. In one or more embodiments, the SiGe base layer may comprise a polycrystalline portion and a monocrystalline portion. The SiGe base layer may be doped with a p-type dopant such as boron. The SiGe base layer may be p+ type doped. The p+ polysilicon layer 50 serves as a base electrode for the transistor.

In one or more embodiments of the invention, the formation of the base layer 120 is followed by the formation of a cap layer on top of the base layer. In one or more embodiments of the invention, the cap layer is a silicon cap layer. Hence, in one or more embodiment of the invention, a silicon cap layer overlies a SiGe base layer.

Figure 12:
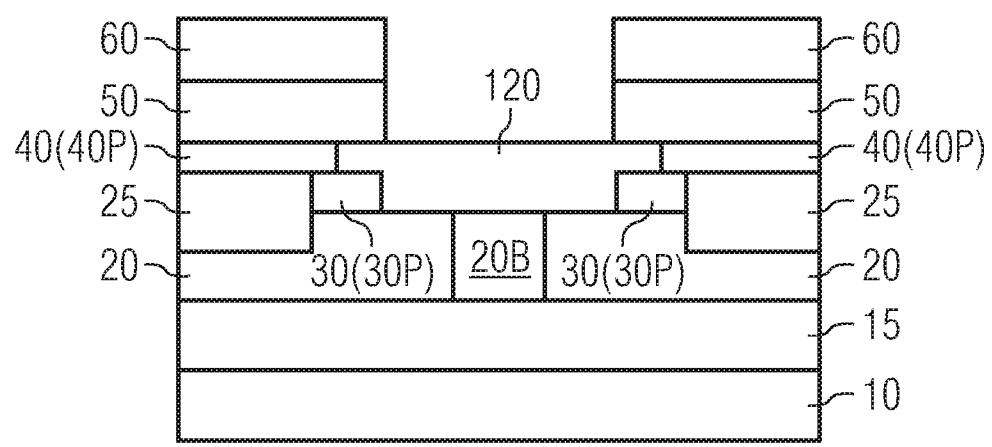
FIG. 12 shows the removal of nitride layers in accordance with an embodiment of the invention.
Figure 13:
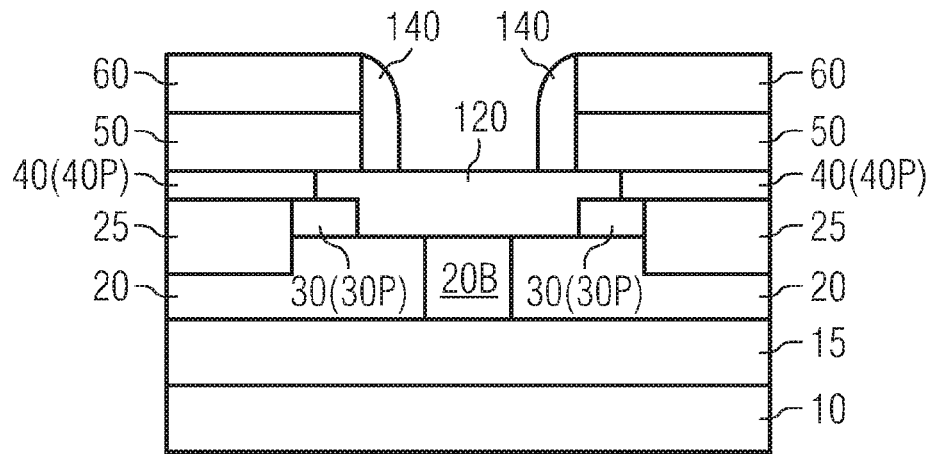
FIG. 13 shows the formation of oxide spacers in accordance with an embodiment of the invention.

FIG. 12 shows the removal of the nitride layer 80 as well as the removal of the nitride layer 70 by wet etching. FIG. 13, shows the formation of oxide spacers 140 on the sidewalls of the polysilicon layer 50 and the oxide layer 60. The oxide spacers may be formed by the conformal deposition of an oxide layer followed by the anisotropic etch of this oxide layer.

Figure 14:
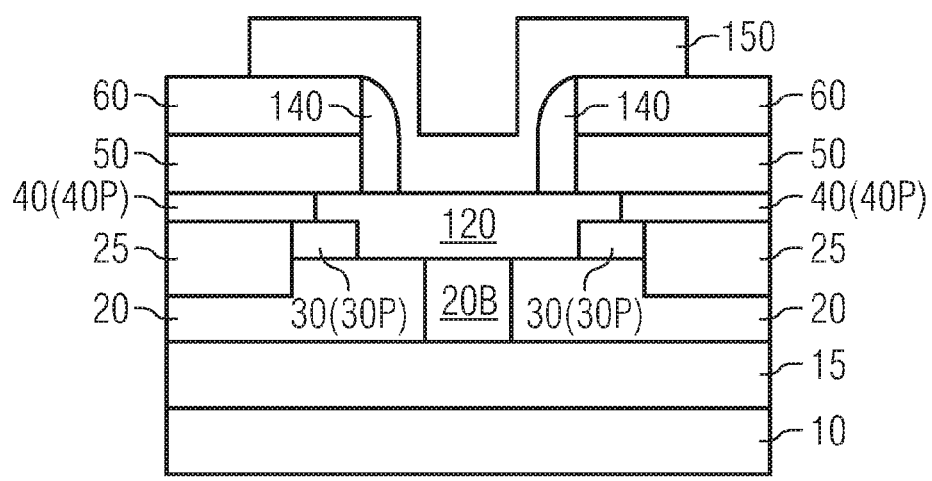
FIG. 14 shows the formation of an emitter layer in accordance with an embodiment of the invention.

Referring to FIG. 14, the formation of the oxide spacers 140 is followed by the formation of the emitter layer 150. The emitter layer 150 may be formed as a heavily n+ doped layer. The emitter layer 150 may be formed from a heavily arsenic-doped material. The emitter layer 150 may be formed so as to grow monocrystalline on the collector area 120 and amorphous on the surrounding oxide layers 140 and 60. After patterning the emitter layer 150, a rapid thermal annealing (RTA) step may be performed, which diffuses the emitter layer a certain distance (for example, about 15 nm to about 30 nm) deep into the underlying silicon cap layer of the base. During the emitter drive-in, the amorphous parts of the emitter layer 150 may become polycrystalline. After the emitter drive-in, processing is completed by salicidation of the one or more base electrodes and by forming the copper metallization (not shown).

Referring to the embodiment of the transistor shown in FIG. 14, it is again observed that a peripheral portion 30P of the first oxide layer 30 is directly disposed on top of the collector layer 20. Placing the oxide layer potion 30P on top of the collector layer 20 reduces the area of the interface between the collector layer 20 and the base layer 120. While not wishing to be bound by theory, it is believed that this may serve to reduce the parasitic capacitance between the base layer 120 and the collector layer 20 of the transistor.

In the embodiment shown, the oxide stack comprising oxide layers 30, 40 includes two oxide layers (a first oxide layer 30 and a second oxide layer 40). In one or more embodiments of the invention, the two different oxide layers are etched at different rates. In an embodiment of the invention, the etch process is chosen to that the etch rate r2 of the second oxide layer 40 is greater than the etch rate r1 of the first oxide layer 30. The etch rates of the two layers may depend upon the material composition of each of the two layers as well as the etchant used to etch the layers.

In an alternate embodiment of the invention, it is possible that the first oxide layer and the second oxide layer may have the same etch rate.

In an alternate embodiment of the invention, the oxide stack may comprise a stack of more that two oxide layers. In an embodiment of the invention, each of the oxide layers may be etched at a different rate. In an embodiment of the invention, each oxide layer of the oxide stack may be etched at a rate which is greater than the etch rates of the oxide layers (also belonging to the oxide stack) which are underlying it. Hence, in an embodiment of the invention, the oxide stack may be formed of three oxide layers such that the third oxide layer of the stack is formed over the second oxide layer of the stack is formed over the first oxide layer of the stack. The etch process may be performed such that the etch rate R3 of the third layer is greater than the etch rate R2 of the second layer is greater than the etch rate R1 of the first layer (that is R3>R2>R1).

In yet another embodiment of the invention, it is possible that the oxide stack be replaced with, more generally, a dielectric stack comprised of a plurality of dielectric layers. Each of the dielectric layers may be formed of one or more dielectric materials such as oxides and/or nitrides. In an embodiment of the invention, an etch process may be carried out such that the etch rate of each of the dielectric layers of the dielectric stack is greater than the etch rate of the dielectric layers (of the dielectric stack) that are underlying it.

Referring again to FIG. 10, it yet another embodiment of the invention, it is possible that the two oxide layers 30, 40 be replaced with a single oxide layer (or a single dielectric layer). It is possible that a single oxide layer (or a single dielectric layer) be appropriately etched (such as by an isometric etch) so as to create an opening that is wider at the top than at the bottom.

The process shown in FIGS. 1 through 14 provides an example of a process for forming an embodiment of a heterojunction bipolar transistor of the present invention. A heterojunction bipolar transistor may also be referred to as a heterobipolar transistor or an HBT. The heterojunction transistor may be a SiGe heterojunction transistor comprising a SiGe base layer. In one or more embodiments of the present invention, the SiGe base layer may be formed from any SiGe material. In one or more embodiments of the invention, the SiGe material may have the atomic composition $Si_{1-x}Ge_x$ where X is greater than 0 and less than 1. In one or more embodiments of the invention, the SiGe base layer does not include C (the element carbon). In one or more embodiments of the invention, the SiGe base layer includes C (the element carbon).

In one or more embodiments of the invention, the base layer may be a SiGeC base layer. In one or more embodiments of the invention the base layer may be a SiC base layer. In one or more embodiments of the invention the base layer may comprise Si (the element silicon) and Ge (the element germanium). In one or more embodiments of the invention the base layer may comprise C (the element carbon). In one or more embodiments of the invention, the base layer may comprise Si, Ge and C (the elements silicon, germanium and carbon). In one or more embodiments of the invention, the base layer may comprise an alloy of two or more elements. In one or more embodiments of the invention, the base layer may comprise a binary alloy or compound. In one or more embodiments of the invention, the base layer may comprise a tertiary alloy or compound. In one or more embodiments of the invention, the base layer may be doped with a p-type dopant (such as boron). In one or more embodiments of the invention, the base layer may be p+ type doped. In one or more embodiments of the invention, the base layer may comprise a composite material (for example, the base layer may comprise two or more sublayers). In one or more embodiments of the invention, the base layer may comprise a graded material (for example, the graded material may have a graded composition).

In one or more alternate embodiments of the invention, the p+ polysilicon layer 50 may be replaced with a different material such as a different conductive material. Likewise, the oxide layer 60, the nitride layer 70, the nitride layer 80 and the polysilicon layer 90 are not limited to these materials. One or more of these layers may replaced with other materials such as materials having the proper selectivity with respect to one another.

In addition, the embodiment explained above has been for n-p-n transistors. In another embodiment of the invention, it is possible to apply the same concepts to a p-n-p transistor.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A heterojunction bipolar transistor, comprising:
   a collector layer;
   a dielectric stack including at least a first dielectric layer overlying said collector layer and a second dielectric layer overlying said first dielectric layer, said second dielectric layer being different from said first dielectric layer, said stack having an opening therethrough, said opening overlying said collector layer, said opening including a first portion through said first dielectric layer and a second portion through said second dielectric layer, said second portion of said opening being wider than said first portion of said opening; and
   a base layer having a first portion disposed within said first portion of said opening and a second portion disposed within said second portion of said opening.

2. The transistor of claim 1, wherein said first dielectric layer is a first oxide layer and said second dielectric layer is a second oxide layer, said second oxide layer being different from said first oxide layer.

3. The transistor of claim 1, wherein said stack is in direct contact with said collector layer.

4. The transistor of claim 1, wherein said collector layer comprises an n-type material, said base layer comprises a p-type material.

5. The transistor of claim 1, wherein said base layer is in direct contact with said collector layer.

6. The transistor of claim 1, wherein said base layer is a SiGe base layeror a SiGeC base layer.

7. The transistor of claim 1, wherein a first part of said second portion of said base layer overlies said first portion of said base layer and a second part of said second portion of said base layer overlies said first dielectric layer of said dielectric stack.

8. The transistor of claim 1, wherein said first dielectric layer comprises a first dielectric material and said second dielectric layer comprises a second dielectric material different from said first dielectric material.

9. The transistor of claim 1, wherein said opening has a step-like structure.

10. The transistor of claim 9, wherein said first portion of said opening has essentially vertical sidewall(s) and/or sloped sidewall(s), and wherein said second portion of said opening has essentially vertical sidewall(s) and/or sloped sidewall(s).

11. The transistor of claim 1, wherein said base layer comprises silicon and germanium.

12. The transistor of claim 11, wherein said. base layer further comprises carbon.

13. The transistor of claim 1, further comprising an emitter layer overlying said base layer.

14. The transistor of claim 13, wherein said second portion of said base layer overlies said first portion of said base layer, and wherein said emitter layer overlies said second portion of said base layer.

15. The transistor of claim 13, further comprising a cap layer between said emitter layer and said base layer.

16. A heterojunction bipolar transistor, comprising:
    a collector layer;
    a first dielectric layer overlying said collector layer, said first dielectric layer having a first opening therethrough, said first opening overlying said collector layer;
    a second dielectric layer having a second opening therethrough, said second opening overlying said first opening, said second opening being wider than said first opening, said second dielectric layer being different from said first dielectric layer;
    a base layer having a first portion disposed within said first opening and a second portion disposed within said second opening; and
    an emitter layer overlying said base layer.

17. The transistor of claim 16, wherein said second dielectric layer overlies said first dielectric layer.

18. The transistor of claim 16, wherein said first dielectric layer is a first oxide layer and said second dielectric layer is a second oxide layer different from said first oxide layer.

19. The transistor of claim 16, wherein said collector layer comprises an n-type material, said base layer comprise a p-type material.

20. The transistor of claim 16, wherein said base layer comprises silicon and germanium.

21. The transistor of claim 16, wherein said base layer further comprises carbon.

22. The transistor of claim 16, wherein said base layer is a SiGe base layer or a SiGeC base layer.

23. The transistor of claim 16, wherein said second portion of said base layer overlies said first portion of said base layer, and wherein said emitter layer overlies said second portion of said base layer.

24. The transistor of claim 16, wherein a first part of said second portion of said base layer overlies said first portion of said base layer and a second part of said second portion of said base. layer overlies said first dielectric layer.

25. The transistor of claim 16, further comprising a cap layer between said base layer and said emitter layer.

26. The transistor of claim 16, wherein said first dielectric layer comprises a first dielectric material and said second dielectric layer comprises a second dielectric material different from said first dielectric material.

* * * * *